(12) United States Patent
Fujishiro

(10) Patent No.: US 9,728,246 B2
(45) Date of Patent: Aug. 8, 2017

(54) SEMICONDUCTOR DEVICE SUPPRESSING BTI DETERIORATION

(71) Applicant: Micron Technology, Inc., Boise, ID (US)

(72) Inventor: Keisuke Fujishiro, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/236,281

(22) Filed: Aug. 12, 2016

(65) Prior Publication Data

US 2016/0351246 A1    Dec. 1, 2016

Related U.S. Application Data

(62) Division of application No. 14/315,951, filed on Jun. 26, 2014, now Pat. No. 9,424,907.

(51) Int. Cl.
| | |
|---|---|
| *G11C 7/00* | (2006.01) |
| *G11C 11/4076* | (2006.01) |
| *G11C 11/4093* | (2006.01) |
| *G11C 11/4094* | (2006.01) |
| *G11C 11/4091* | (2006.01) |
| *G11C 11/4096* | (2006.01) |
| *G11C 11/406* | (2006.01) |

(52) U.S. Cl.
CPC ........ *G11C 11/4076* (2013.01); *G11C 11/406* (2013.01); *G11C 11/4091* (2013.01); *G11C 11/4093* (2013.01); *G11C 11/4094* (2013.01); *G11C 11/4096* (2013.01); *G11C 11/40626* (2013.01)

(58) Field of Classification Search
CPC .......... G11C 2207/2272; G11C 7/1063; G11C 29/842
USPC ............ 365/193, 194, 230.01, 233.1, 233.11
See application file for complete search history.

(56) References Cited

U.S. PATENT DOCUMENTS

| | | | |
|---|---|---|---|
| 8,305,804 B2 | 11/2012 | Kim et al. | |
| 2004/0042312 A1 | 3/2004 | Kim et al. | |
| 2004/0184325 A1* | 9/2004 | Fujioka | G11C 7/1018 365/191 |
| 2004/0240305 A1 | 12/2004 | Kato | |
| 2010/0329041 A1 | 12/2010 | Sohn et al. | |
| 2011/0058437 A1* | 3/2011 | Miyano | G11C 7/1066 365/222 |
| 2012/0147692 A1* | 6/2012 | Nakamura | G11C 7/1066 365/233.1 |
| 2012/0155212 A1* | 6/2012 | Kodama | G11C 7/1042 365/233.14 |

(Continued)

FOREIGN PATENT DOCUMENTS

JP    2007-323770    12/2007

*Primary Examiner* — Han Yang
(74) *Attorney, Agent, or Firm* — Dorsey & Whitney LLP

(57) ABSTRACT

Disclosed herein is a device includes a command generation circuit that activates first and second command signals, an internal circuit that includes a plurality of transistors that are brought into a first operation state when at least one of the first and second command signals is activated, and an output gate circuit that receives a first signal output from the internal circuit, the output gate circuit being configured to pass the first signal when the second command signal is deactivated and to block the first signal when the second command signal is activated.

18 Claims, 7 Drawing Sheets

(56) References Cited

U.S. PATENT DOCUMENTS

2014/0003178 A1   1/2014   Song

* cited by examiner

SEMICONDUCTOR DEVICE SUPPRESSING BTI DETERIORATION

CROSS-REFERENCE TO RELATED APPLICATION

This application is a divisional of U.S. patent application Ser. No. 14/315,951, filed Jun. 26, 2014, U.S. Pat. No. 9,424,907 issued on Aug. 23, 2016. This application is incorporated by reference herein in its entirety and for all purposes.

BACKGROUND

Field of the Invention

The present invention relates to a semiconductor device, and particularly to a semiconductor device having a transistor that might undergo BTI (Bias Temperature Instability) deterioration.

Description of Related Art

As for MOS transistors that are frequently used in semiconductor devices such as DRAM (Dynamic Random Access Memory), a kind of aging deterioration called BTI deterioration is known to occur. The BTI deterioration makes a threshold voltage of a transistor rise gradually when the transistor continues to be ON, thereby entailing a decrease in drain current. A transistor in which the BTI deterioration occurs causes trouble such as a disturbance in the duty of passing signals. The BTI deterioration can occur both in P-channel MOS transistors and N-channel MOS transistors. The former is known as NBTI (Negative BTI) deterioration, and the latter as PBTI (Positive BTI) deterioration.

Japanese Patent Application Laid-Open No. 2007-323770 discloses the invention for suppressing the occurrence of BTI deterioration of MOS transistors that make up memory cells of SRAM (Static Random Access Memory).

Usually, on transmission paths of various control signals, internal circuits, such as inverter circuits responsible for buffering or delaying of signals, that contain a plurality of transistors are provided. The transistors in such internal circuits might remain turned ON for a long time if the logic state of corresponding control signals is fixed for a long time. This might cause the above-described BTI deterioration in the transistors of the internal circuits. Therefore, improvement is required.

SUMMARY

In one embodiment, there is provided a semiconductor device that includes a command generation circuit that activates first and second command signals, an internal circuit that includes a plurality of transistors that are brought into a first operation state when at least one of the first and second command signals is activated, and an output gate circuit that receives a first signal output from the internal circuit, the output gate circuit being configured to pass the first signal when the second command signal is deactivated and to block the first signal when the second command signal is activated.

According to the present invention, even if the first command signal is not generated (or if the logic state of the first command signal is fixed to an inactivated state), a plurality of transistors inside the internal circuit corresponding to the first command can be put in the same first operation state as when the first command signal is generated, when the second command signal is generated. Moreover, the internal circuit is configured in such a way that a plurality of transistors inside the internal circuit become the first operation state in response to the second command. Therefore, the first operation state is not kept for a long time. As a result, it is possible to suppress the occurrence of BTI deterioration in a plurality of transistors inside the internal circuit.

DETAILED DESCRIPTION OF THE EMBODIMENTS

Hereinafter, with reference to the accompanying drawings, preferred embodiments of the present invention will be described in detail.

Figure 1:
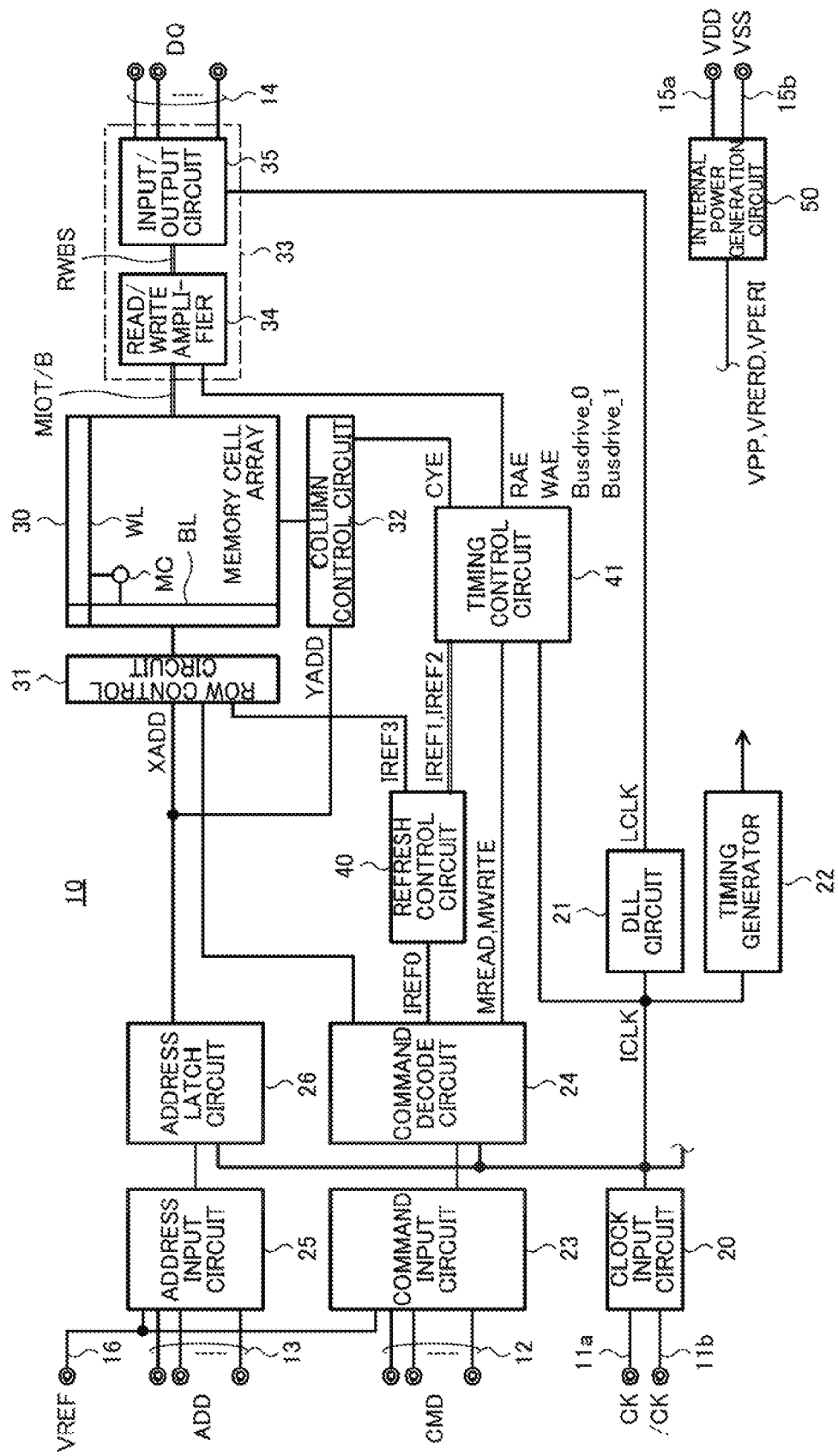
FIG. 1 is a diagram showing the system configuration of a semiconductor device according to a first embodiment of the present invention.

A semiconductor device 10 of a first embodiment of the present invention is SDRAM (Synchronous Dynamic Random Access Memory) of a DDR3 type. As shown in FIG. 1, the semiconductor device 10 includes the following external terminals: clock terminals 11a and 11b, command terminals 12, address terminals 13, data input/output terminals 14, and power supply terminals 15a, 15b and 16.

The clock terminals 11a and 11b are terminals to which external clock signals CK and /CK are supplied. The supplied external clock signals CK and /CK are supplied to a clock input circuit 20. The clock input circuit 20 generates a single-phase internal clock signal ICLK based on the external clock signals CK and /CK, and supplies the single-phase internal clock signal ICLK to various circuits that make up the semiconductor device 10, such as a DLL circuit 21, a timing generator 22, a command decode circuit 24, an address latch circuit 26 and a timing control circuit 41. Incidentally, in this specification, the signals whose name starts with "/" indicate inverted signals of corresponding signals or low-active signals. Accordingly, the external clock signals CK and /CK are complementary to each other.

The DLL circuit 21 is a circuit that receives the internal clock signal ICLK and generates an internal clock signal LCLK that has been phase-controlled with respect to the external clock signals CK and /CK and has been duty-controlled. The generated internal clock signal LCLK is supplied to an input/output circuit 35. The timing generator 22 is a circuit that generates another internal clock signal based on outputting of the internal clock signal ICLK to supply to other internal circuits.

The command terminals 12 are terminals to which various command signals CMD, including the following signals, are supplied: clock enable signal CKE, row address strobe signal /RAS, column address strobe signal /CAS, write enable signal /WE, chip select signal /CS, on-die termination signal ODT, and reset signal /RESET. The command signals CMD supplied to the command terminals 12 are supplied to the command decode circuit 24 via a command input circuit 23.

The command decode circuit 24 is a circuit (command generation circuit) that generates various internal commands by holding, decoding or counting the command signals CMD. The internal commands generated by the command decode circuit 24 include a refresh command IREF0 (second command signal), a read command MREAD (first command signal), and a write command MWRITE.

Incidentally, there are various types of refresh, such as self-refresh, auto-refresh and per-bank-refresh. Different internal commands are actually used for each type of refresh. However, in the case of the present embodiment, the internal commands for all the types of refresh are collectively referred to as "refresh commands IREF0." Refresh control is usually repeated many times periodically. If auto-refresh or per-bank-refresh is carried out, the repeating is controlled by an external controller. If self-refresh is carried out, a refresh control circuit 40, which will be described later, autonomously controls the repeating. Thus, the refresh commands IREF0 are signals that are periodically activated when refresh control is being carried out.

Various internal commands generated by the command decode circuit 24 are supplied to each of the circuits inside the semiconductor device 10. More specifically, the refresh command IREF0 is supplied to a refresh control circuit 40 (second control circuit); read commands MREAD and write commands MWRITE are supplied to the timing control circuit 41 (first control circuit). The refresh control circuit 40 and the timing control circuit 41 will be detailed later.

The address terminals 13 include a plurality of terminals to which each bit of an address signal ADD, which consists of a plurality of bits, is supplied. The address signal ADD supplied to the address terminals 13 is supplied to the address latch circuit 26 via an address input circuit 25. The address latch circuit 26 is a circuit that latches the address signal ADD in synchronization with the internal clock signal ICLK.

The address signal ADD is usually a signal for specifying one or a plurality of memory cells in a memory cell array 30. In the memory cell array 30, a plurality of word lines WL cross a plurality of bit lines BL; at the intersections of those lines, memory cells MC are disposed. This means that, in the memory cell array 30, a plurality of memory cells MC are disposed in a matrix pattern. Incidentally, one word line WL, one bit line BL and one memory cell MC are exemplified in FIG. 1. Moreover, as later described in FIG. 3, the bit line BL actually consists of bit lines BLT and BLB that are paired.

An address signal ADD that is supplied to the address terminals 13 at a time when an act command is supplied to the command terminals 12 contains a row address XADD, which specifies a word line WL. The row address XADD is supplied to a row control circuit 31. Meanwhile, an address signal ADD that is supplied to the address terminals 13 at a time when a column access command (read command or write command) is supplied to the command terminals 12 contains a column address YADD, which specifies a bit line BL. The column address YADD is supplied to a column control circuit 32.

An address signal ADD that emerges when the semiconductor device 10 is in a mode register set mode is supplied to a mode register (not shown). The mode register is a circuit in which various kinds of information indicated by address signals ADD are set. The mode register is referenced by each circuit inside the semiconductor device 10.

The row control circuit 31 is a circuit that selects a word line WL corresponding to the row address XADD, out of a plurality of word lines WL in the memory cell array 30. The column control circuit 32 is a circuit that selects a bit line BL corresponding to the column address YADD, out of a plurality of bit lines BL in the memory cell array 30. Incidentally, a column switch 71 (FIG. 3), which will be described later, is part of the column control circuit 32. A bit line BL selected by the column control circuit 32 is connected to a read/write amplifier 34 inside the data input/output circuit 33 via a sense amplifier 70 (See FIG. 3), which will be described later.

The power supply terminals 15a and 15b are terminals to which external power supply voltages VDD and VSS are supplied, respectively. The external power supply voltages VDD and VSS that are supplied to the power supply terminals 15a and 15b are supplied to each of the circuits inside the semiconductor device 10, including an internal power generation circuit 50. The internal power generation circuit 50 is a circuit that generates various kinds of internal power supply voltages, such as internal power supply voltages VPP, VRERD, VPERI, SAP and SAN that have different voltage values from the external power supply voltage VDD, from the external power supply voltages VDD and VSS. Those internal power supply voltages are also supplied to each of the circuits inside the semiconductor device 10.

The power supply terminal 16 is a terminal to which a reference voltage VREF is supplied. The voltage value of the reference voltage VREF is one-half of the external power supply voltage VDD. The reference voltage VREF is used as a reference voltage when a logical decision is made on signals that are input from outside in the address input circuit 25 and the command input circuit 23.

The data input/output terminals 14 include a plurality of terminals each of which is connected to the input/output circuit 35 in the data input/output circuit 33. The plurality of terminals include terminals for outputting of read data DQ and accepting inputting of write data DQ; and data strobe terminals for accepting inputting of a data strobe signal, which specifies the inputting and outputting timing. If the number of the former terminals is equal to N, N=16 in the case of the semiconductor device 10 of the present embodiment. The input/output circuit 35 is connected to the memory cell array 30 via the read/write amplifier 34.

During a read operation, the read data DQ amplified by a sense amplifier is amplified further by the read/write amplifier 34. Then, the read data DQ passes through the input/output circuit 35, and is output to the outside from the data input/output terminals 14. During a write operation, the write data DQ that is input from the outside via the data input/output terminals 14 passes through the input/output circuit 35, and is input to the read/write amplifier 34. Then, the write data DQ is amplified before being supplied to a sense amplifier.

Hereinafter, with reference to FIGS. 2 and 3, the specific configuration of each circuit pertaining to the above operations will be described in detail.

First, as described above, the semiconductor device 10 includes N data input/output terminals 14 for outputting of read data DQ and accepting inputting of write data DQ. Hereinafter, if there are a plurality of the same structures like the input/output terminals 14, a serial number that starts with 0, such as _0, _1, . . . , is added as reference symbols to distinguish between the structures. According to this method, the semiconductor device 10 includes N data input/output terminals 14_0 to 14_N−1.

Figure 2:
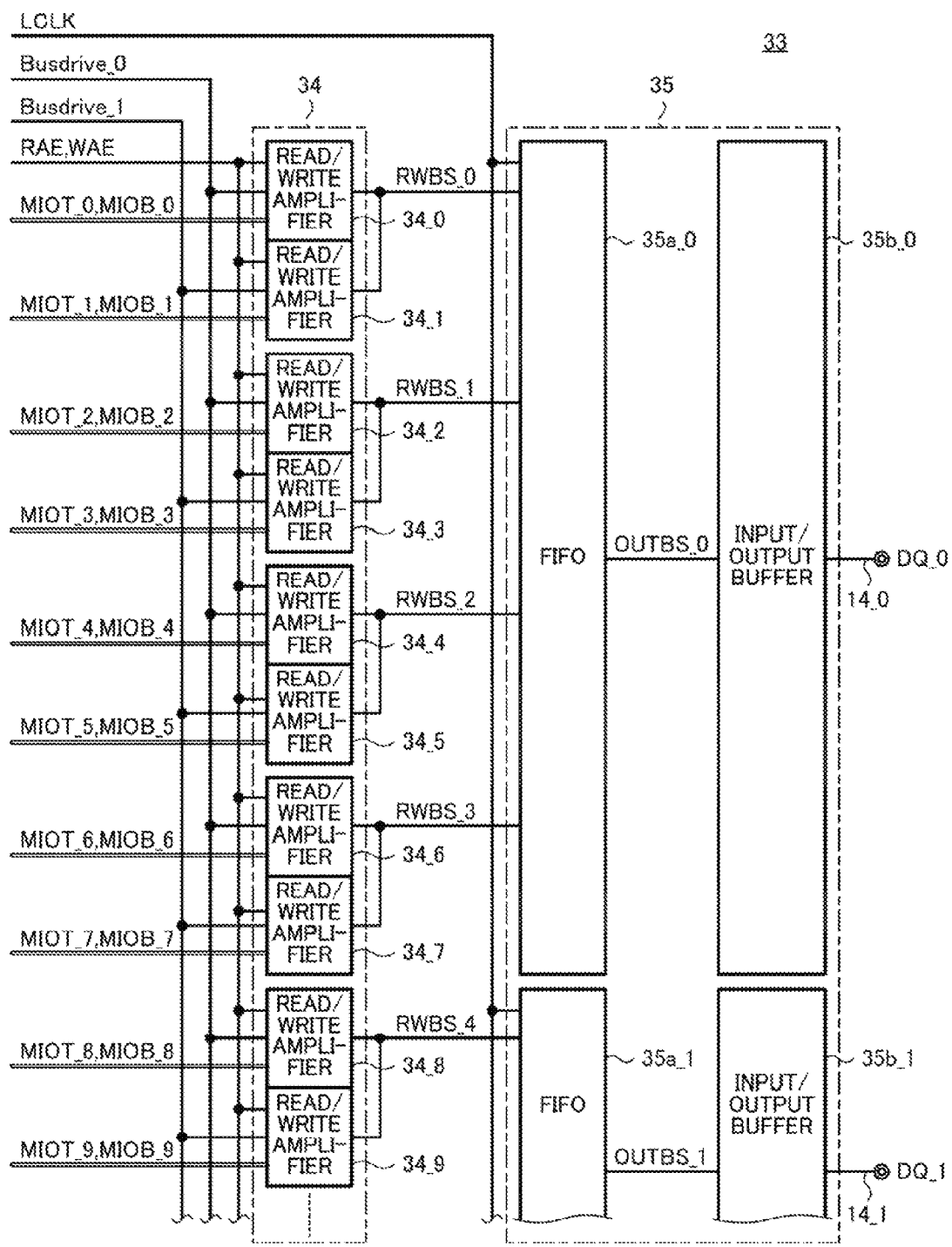
FIG. 2 is a diagram showing the internal configuration of a data input/output circuit shown in FIG. 1.

As shown in FIG. 2, the input/output circuit 35 includes an input/output buffer 35b, an internal bus OUTBS, and a FIFO 35a for each data input/output terminal 14. The $n^{th}$ input/output buffer 35b_n (n is an integer ranging from 0 to N−1) is connected to the FIFO 35a_n via the internal bus OUTBS_n. Each FIFO 35a is so configured as to operate in synchronization with the internal clock signal LCLK supplied from the DLL circuit 21 shown in FIG. 1.

The semiconductor device 10 includes 8×N read/write amplifiers 34 and 4×N read/write buses RWBS. Each FIFO 35a is connected to eight read/write amplifiers 34 via four read/write buses RWBS. More specifically, the $n^{th}$ FIFO 35a_n is connected to two read/write amplifiers 34_8n and 34_8n+1 via the read/write bus RWBS_4n, and to two read/write amplifiers 34_8n+2 and 34_8n+3 via the read/write bus RWBS_4n+1, and to two read/write amplifiers 34_8n+4 and 34_8n+5 via the read/write bus RWBS_4n+2, and to two read/write amplifiers 34_8n+6 and 34_8n+7 via the read/write bus RWBS_4n+3.

Each read/write amplifier 34 is connected to a pair of main IO lines MIOT and MIOB. More specifically, the $m^{th}$ read/write amplifier 34_m (m is an integer ranging from 0 to 8N−1) is connected to the $m^{th}$ pair of main IO lines MIOT_m and MIOB_m. Moreover, to each read/write amplifier 34, from the timing control circuit 41 shown in FIG. 1, a read enable signal RAE and a write enable signal WAE are supplied in common. Furthermore, to the even-numbered read/write amplifiers 34_2k (k is an integer ranging from 0 to 4N−1), from the timing control circuit 41, a bus drive signal Busdrive_0 is supplied in common. To the odd-numbered read/write amplifiers 34_2k+1, from the timing control circuit 41, a bus drive signal Busdrive_1 is supplied in common.

Figure 3:
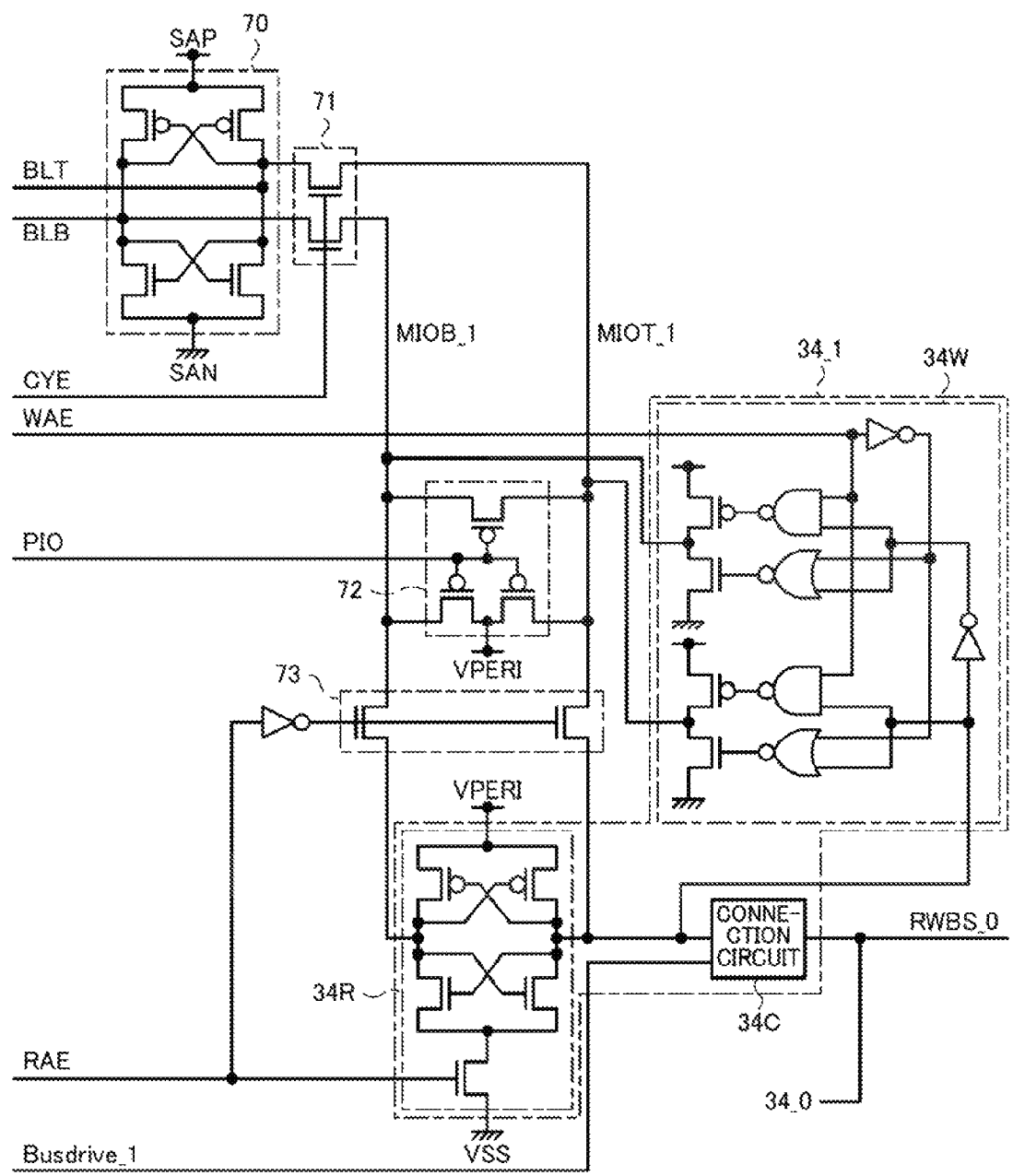
FIG. 3 is a diagram showing the configuration of circuits related to a read/write amplifier shown in FIG. 2.

As shown in FIG. 3, the read/write amplifier 34_1 includes a read amplifier 34R, a write amplifier 34W, and a connection circuit 34C. Incidentally, FIG. 3 only shows the read/write amplifier 34_1 and the circuits related to the read/write amplifier 34_1. However, the same is true for the other read/write amplifiers 34_m and the circuits related to the read/write amplifiers 34_m. The following description focuses on the read/write amplifier 34_1.

The read amplifier 34R includes two CMOS inverters that are connected in a cross-multiplication manner between the corresponding main IO lines MIOT_1 and MIOB_1 that are paired. As the high-potential-side power supply potential and low-potential-side power supply potential of those CMOS inverters, the power supply potential VPERI and the power supply potential VSS are supplied from the internal power generation circuit 50 shown in FIG. 1. The read amplifier 34R further includes a N-channel MOS transistor, which is provided between the CMOS inverters and the power supply line through which the power supply potential VSS is supplied. To the gate electrode of the N-channel MOS transistor, the read enable signal RAE is supplied. Therefore, the read amplifier 34R operates only when the read enable signal RAE is activated.

The read amplifier 34 is designed to amplify a potential difference that emerges between the corresponding main IO lines MIOT_1 and MIOB_1 that are paired. As shown in FIG. 3, the main IO line MIOT_1 is connected to the read/write bus RWBS_0 via the connection circuit 34c. When the connection circuit 34c is in a connection state, the potential of the main IO line MIOT_1 that has been amplified by the read amplifier 34R is reflected in the read/write bus RWBS_0.

The write amplifier 34W, as is clear from the circuit configuration shown in FIG. 3, is a circuit that, under condition of that the write enable signal WAE is at a high level (or in an activated state), controls in such a way as to bring the potential of the main IO line MIOT_1 to a high level and the potential of the main IO line MIOB_1 to a low level when the potential of the read/write bus RWBS_0 is at a high level, and controls in such a way as to bring the potential of the main IO line MIOT_1 to a low level and the potential of the main IO line MIOB_1 to a high level when the potential of the read/write bus RWBS_0 is at a low level. When the write enable signal WAE is at a low level (or in an inactivated state), an output terminal of the write amplifier 34W is in a high-impedance state; the write amplifier 34W does not carry out the control of potential of the pair of main IO lines MIOT_1 and MIOB_1.

The connection circuit 34C is a switch circuit that turns conductive when the bus drive signal Busdrive_1 supplied from the timing control circuit 41 is in an activated state, and turns non-conductive when the bus drive signal Busdrive_1 is in an inactivated state. When the connection circuit 34C is conductive, the read/write bus RWBS_0 is connected to the main IO line MIOT_1 and the write amplifier 34W. When the connection circuit 34C is non-conductive, the read/write bus RWBS_0 is disconnected from the main IO line MIOT_1 and the write amplifier 34W.

Although not shown in the diagram, the connection circuit 34C of the read/write amplifier 34_0 is a switch circuit that turns conductive when the bus drive signal Busdrive_0 supplied from the timing control circuit 41 is in an activated state, and turns non-conductive when the bus drive signal Busdrive_0 is in an inactivated state. The timing control circuit 41 shown in FIG. 1 controls the state of the bus drive signals Busdrive_1 and Busdrive_0 in such a way as to prevent the bus drive signals Busdrive_1 and Busdrive_0 from becoming activated at the same time. Accordingly, the connection circuit 34C of the read/write amplifier 34_1 and the connection circuit 34C (not shown) of the read/write amplifier 34_0 do not become conductive at the same time; the two main IO lines MIOT therefore are not connected to the read/write bus RWBS_0 at the same time.

As shown in FIG. 3, between a pair of bit lines BLT and BLB and the read amplifier 34R, a sense amplifier 70, a column switch 71, a precharge circuit 72, and an IO switch 73 are provided in this order from the pair of bit lines BLT and BLB.

The sense amplifier 70 includes two CMOS inverters that are connected in a cross-multiplication manner between the corresponding bit lines BLT and BLB that are paired. As the high-potential-side power supply potential and low-potential-side power supply potential of those CMOS inverters, the power supply potential SAP and the power supply potential SAN are supplied from the internal power generation circuit 50 shown in FIG. 1. The sense amplifier 70 is designed to amplify, to SAP-SAN, a very small potential difference that emerges between the corresponding bit lines BLT and BLB that are paired.

The column switch 71 includes a N-channel MOS transistor, which is provided between the bit line BLT and the main IO line MIOT_1; and a N-channel MOS transistor, which is provided between the bit line BLB and the main IO line MIOB_1. To the gate electrodes of those transistors, a column switch enable signal CYE is supplied in common from the timing control circuit 41 shown in FIG. 1. Therefore, the column switch 71 turns conductive when the column switch enable signal CYE is activated, and thereby connects the pair of bit lines BLT and BLB to the pair of main IO lines MIOT_1 and MIOB_1. When the column switch enable signal CYE is inactivated, the column switch 71 disconnects the pair of bit lines BLT and BLB from the pair of main IO lines MIOT_1 and MIOB_1.

It is clear from the circuit configuration shown in FIG. 3 that the precharge circuit 72 is a circuit that sets the potential of the main IO line MIOT_1 and the potential of the main IO line MIOB_1 to the above-described power supply potential VPERI when a precharge signal PIO supplied from a control circuit (not shown) becomes activated to a low level. The precharge signal PIO is controlled in such a way that the precharge signal PIO becomes activated when both the read operation and the write operation are not performed.

The IO switch 73 includes a N-channel MOS transistor, which is provided on the main IO line MIOT_1; and a N-channel MOS transistor, which is provided on the main IO line MIOB_1. To the gate electrodes of those transistors, an inverted signal of the read enable signal RAE that is supplied to the read amplifier 34R is supplied in common.

Figure 6A:
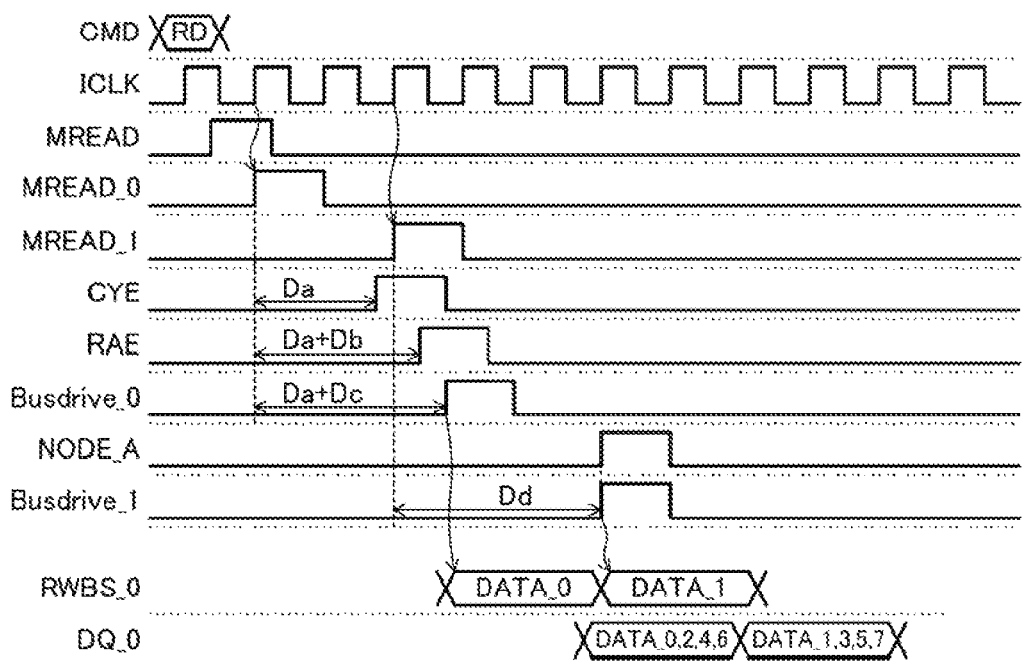
FIG. 6A is a timing chart showing changes over time of various signals pertaining to internal circuits of the timing control circuit shown in FIG. 2 during a read operation.

As shown in FIG. 6A, which will be described later, when the read operation is carried out, the timing control circuit 41 shown in FIG. 1 is so configured as to first activate the column switch enable signal CYE and then the read enable signal RAE. During a period from when the column switch enable signal CYE becomes activated until when the read enable signal RAE becomes activated, the sense amplifier 70 amplifies a potential difference between the main IO lines MIOT_1 and MIOB_1 to SAP-SAN. After the read enable signal RAE is activated, the potential difference is further amplified by the read amplifier 34R to VPERI-VSS. As a result, to the read/write bus RWBS_0, VPERI or VSS is supplied.

The specific configuration of each circuit pertaining to the read operation and the write operation has been described in detail. Returning to FIG. 1, the refresh control circuit 40 and the timing control circuit 41 will be described in detail.

The refresh control circuit 40 is a circuit that controls a refresh operation of the memory cell array 30. The refresh operation is carried out by activating word lines WL. Accordingly, the refresh control circuit 40 is so configured as to control the row control circuit 31 based on a refresh command IREF0. That is, the control (second control) conducted by the refresh control circuit 40 is of row access (Row access). More specifically, based on a refresh command IREF0, the refresh control circuit 40 generates a refresh command IREF3 and supplies the refresh command IREF3 to the row control circuit 31. The row control circuit 31 has a built-in refresh address counter (not shown), which generates a row address for a refresh target. The row control circuit 31 carries out the refresh operation by activating, at a timing indicated by the refresh command IREF3, a word line WL corresponding to a row address generated by the refresh address counter.

The refresh control circuit 40 also has a function of generating, based on the refresh command IREF0, refresh commands IREF1 and IREF2 (third and fourth command signals) and supplying the refresh commands IREF1 and IREF2 to the timing control circuit 41. The refresh commands IREF1 and IREF2 are commands that are activated to a high level when the refreshing is performed, which will be described in detail together with the timing control circuit 41.

The timing control circuit 41 is a circuit that controls the operation timing of the column control circuit 32 and read/write amplifier 34 when the read or write operation is carried out. In order to allow the timing control circuit 41 to carry out such control operation, to the timing control circuit 41, a read command MREAD, a write command MWRITE and an internal clock signal ICLK are supplied. As described above, the column control circuit 32 is a circuit that selects a bit line BL. As described above with reference to FIG. 3, the read/write amplifier 34 is a circuit that is related to bit lines BL. Therefore, the control (first control) conducted by the timing control circuit 41 is of column access (Column access).

Figure 4A:
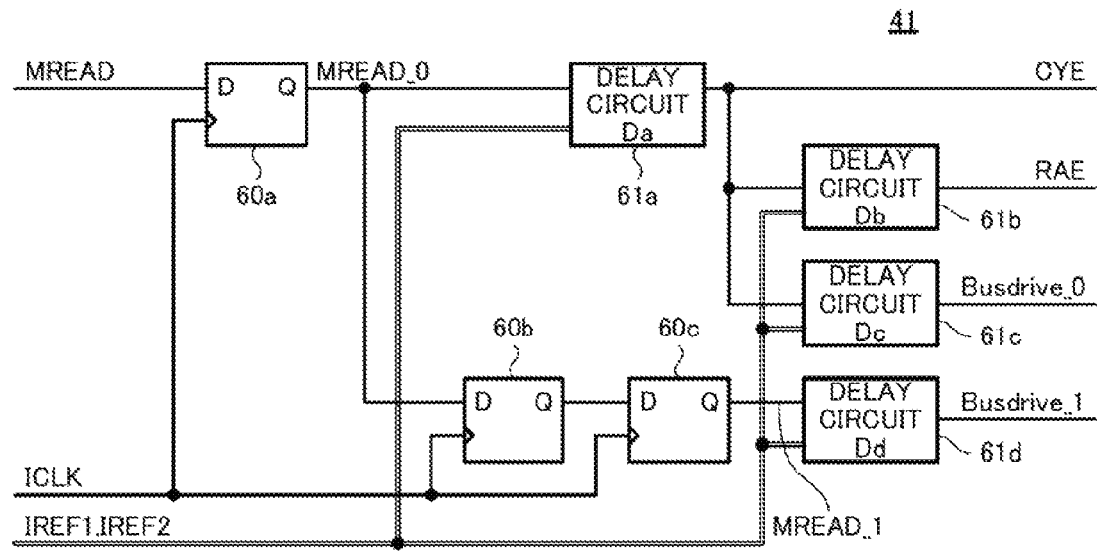
FIG. 4A is a diagram showing some of internal circuits of a timing control circuit shown in FIG. 1 that are related to a read operation.

As shown in FIG. 4A, for the read operation, the timing control circuit 41 includes D-type latch circuits 60a to 60c and delay circuits 61a to 61d. To the clock terminals of the latch circuits 60a to 60c, the internal clock signal ICLK is supplied.

The read command MREAD is supplied to an input terminal of the latch circuit 60a. If a rising edge of the internal clock signal ICLK comes during a period in which the read command MREAD is at High, as shown in FIG. 6A, the read command MREAD_0 that is output from the output terminal of the latch circuit 60a is brought to High. The read command MREAD_0 remains at High until the next rising edge of the internal clock signal ICLK comes.

The read command MREAD_0 is supplied to the delay circuit 61a and the latch circuit 60b. The delay circuit 61a is a circuit that delays the read command MREAD_0 by an amount equivalent to a delay time Da, and outputs as a column switch enable signal CYE. Accordingly, as shown in FIG. 6A, the column switch enable signal CYE is a signal that has been delayed by Da compared with the read command MREAD_0.

The column switch enable signal CYE that is output from the delay circuit 61a is supplied to the column switch 71 shown in FIG. 3 as described above, as well as to the delay circuits 61b and 61c. The delay circuits 61b and 61c are circuits that delay the column switch enable signal CYE by amounts equivalent to delay times Db and Dc, respectively. Output signals of the delay circuits 61b and 61c become a read enable signal RAE and a bus drive signal Busdrive_0, respectively. Accordingly, as shown in FIG. 6A, the read enable signal RAE and the bus drive signal Busdrive_0 are signals that have been delayed by Da+Db and Da+Dc, respectively, compared with the read command MREAD_0. Incidentally, the value of the delay time Dc is set larger than the value of the delay time Db.

The output terminal of the latch circuit 60b, which receives the read command MREAD_0 supplied from the latch circuit 60a, is connected to an input terminal of the latch circuit 60c. That is, the latch circuits 60a to 60c are connected in series. As a result, the read command MREAD_1 output from the output terminal of the latch circuit 60c is delayed by an amount equivalent to two clocks compared with the read command MREAD_0, as shown in FIG. 6A. The read command MREAD_1 is supplied to the delay circuit 61d.

The delay circuit 61*d* is a circuit that delays the read command MREAD_1 by an amount equivalent to a delay time Dd and outputs as a bus drive signal Busdrive_1. Accordingly, as shown in FIG. 6A, the bus drive signal Busdrive_1 is a signal that has been delayed by Dd compared with the read command MREAD_1. The specific value of the delay time Dd is set in such a way that the period from when the bus drive signal Busdrive_0 becomes activated until when the bus drive signal Busdrive_1 becomes activated is equal to the time required to output one set of read data through the read/write bus RWBS.

To the delay circuits 61*a* to 61*d*, from the refresh control circuit 40 shown in FIG. 1, the above-described refresh commands IREF1 and IREF2 are also supplied.

Figure 6B:
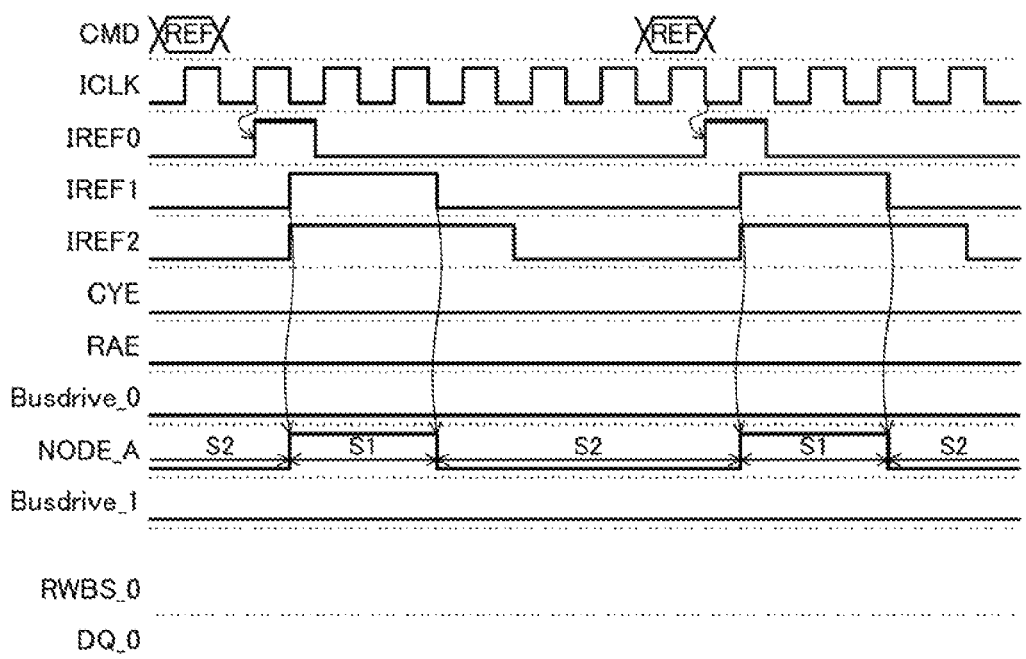
FIG. 6B is a timing chart showing changes over time of various signals pertaining to internal circuits of the timing control circuit shown in FIG. 2 during a refresh operation.

As shown in FIG. 6B, the refresh control circuit 40 is so configured as to activate the refresh commands IREF1 and IREF2 each time the refresh command IREF0 is activated to a high level.

The refresh control circuit 40 controls the period during which the refresh command IREF1 remains activated, in such a way that the period is shorter than an activation cycle of the refresh command IREF0. As a result, when the refresh control is repeated, it is possible to prevent the refresh command IREF1 from being kept activated. Moreover, the refresh control circuit 40 simultaneously activates the refresh commands IREF1 and IREF2, but inactivates the refresh command IREF1 earlier than the refresh command IREF2. Therefore, it is possible to avoid activating the outputs of the delay circuits 61*a* to 61*d* during the refresh control.

The refresh commands IREF1 and IREF2 help to suppress the occurrence of BTI deterioration in a plurality of transistors that make up the delay circuits 61*a* to 61*d*. The details will be described below.

Figure 5A:
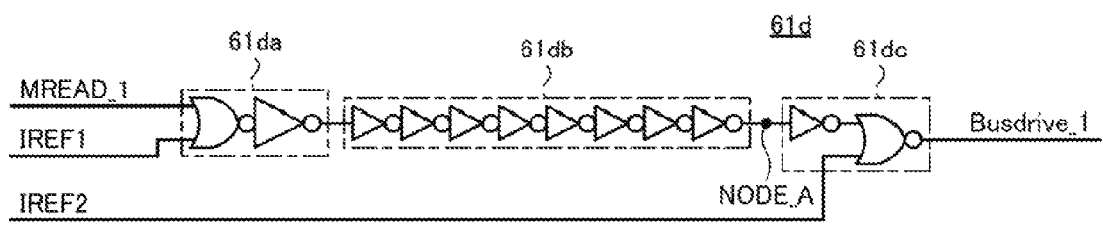
FIG. 5A is a diagram showing the internal configuration of a delay circuit shown in FIG. 2.

As shown in FIG. 5A, the delay circuit 61*d* includes an input gate circuit 61*da*, which is an OR circuit; an internal circuit 61*db*, which includes plural stage of inverter circuits; and an output gate circuit 61*dc*, which is a NOR circuit having an inverter circuit at one input end thereof. Incidentally, FIG. 5A only shows the internal configuration of the delay circuit 61*d*. However, the delay circuits 61*a* to 61*c* have the same internal configuration. A difference in delay time is realized by a difference in the number of inverter circuits that constitute the internal circuit 61*db*. The following description focuses on the delay circuit 61*d*.

To the input gate circuit 61*da*, the read command MREAD_1 and the refresh command IREF1 are supplied. Therefore, the input gate circuit 61*da* outputs different logic states between when either the read command MREAD (first command signal) or the refresh command IREF0 (second command signal) is activated (or when being at a high level) and when neither the read command MREAD nor the refresh command IREF0 is activated (or when being at a low level). More specifically, in the former case, the input gate circuit 61*da* outputs a high level. In the latter case, the input gate circuit 61*da* outputs a low level. The signal (second signal) that is output from the input gate circuit 61*da* is supplied to an input end of a inverter circuit being an initial stage of the plural stage of inverter circuits in the internal circuit 61*db*.

The internal circuit 61*db* is so configured as to be in different operation states depending on the logic state of the output signal of the input gate circuit 61*da*. More specifically, when the output signal of the input gate circuit 61*da* is at a high level, the output of the odd-numbered inverter circuits is at a low level, and the output of the even-numbered inverter circuits is at a high level (First operation state). The internal circuit 61*db* of the present embodiment includes, as shown in FIG. 5A, eight inverter circuits. Therefore, in this case, the potential level of an output node NODE_A of the internal circuit 61*db* is at a high level (Period S1), as shown in FIG. 6B. Meanwhile, when the output signal of the input gate circuit 61*da* is at a low level, the output of the odd-numbered inverter circuits is at a high level, and the output of the even-numbered inverter circuits is at a low level (Second operation state). In this case, the potential level of the output node NODE_A is at a low level (Period S2), as shown in FIG. 6B.

Figure 5B:
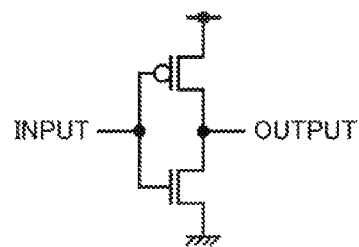
FIG. 5B is a diagram showing the internal configuration of each of inverter circuits that make up an internal circuit shown in FIG. 5A.

As shown in FIG. 5B, each of the inverter circuits that make up the internal circuit 61*db* includes a CMOS having a structure in which a P-channel MOS transistor and a N-channel MOS transistor are connected in series between a high-potential-side power supply wire and a low-potential-side power supply wire. When the internal circuit 61*db* is in the above-described first operation state, the P-channel MOS transistors and N-channel MOS transistors in the odd-numbered inverter circuits are turned OFF and ON, respectively, and the P-channel MOS transistors and N-channel MOS transistors in the even-numbered inverter circuits are turned ON and OFF, respectively. When the internal circuit 61*db* is in the above-described second operation state, the P-channel MOS transistors and N-channel MOS transistors in the odd-numbered inverter circuits are turned ON and OFF, respectively, and the P-channel MOS transistors and N-channel MOS transistors in the even-numbered inverter circuits are turned OFF and ON, respectively.

As can be seen from the above description, if the operation state of the internal circuit 61*db* is fixed, the ON/OFF state of a plurality of transistors that make up the internal circuit 61*db* are fixed, too. Even in either the first or second operation state, if the operation state of the internal circuit 61*db* remains fixed for a long time, the BTI deterioration will occur in a plurality of transistors that make up the internal circuit 61*db*.

If the refresh command IREF1 is fixed to a low level, the operation state of the internal circuit 61*db* is fixed to the second operation state when the read operation is not performed (or when the read command MREAD_1 is at a low level). This means that the BTI deterioration might occur in a plurality of transistors that make up the internal circuit 61*db*. However, in the semiconductor device 10 of the present embodiment, each time the refresh command IREF0 is activated, the refresh command IREF1 is activated to a high level for a period that is shorter than an activation cycle of the refresh command IREF0. Therefore, even during the period in which the read operation is not carried out, the operation state of the internal circuit 61*db* switches back and forth between the first operation state and the second operation state each time the refresh command IREF0 becomes activated. In this manner, it is possible to prevent the operation state of the internal circuit 61*db* from being fixed, even as the read operation is not performed. Thus, the semiconductor device 10 of the present embodiment can suppress the occurrence of the BTI deterioration in a plurality of transistors in the internal circuit 61*db*.

By the way, if the operation state of the internal circuit 61*db* is shifted to the first operation state in response to activation of the refresh command IREF1, then the output signal of the internal circuit 61*db* becomes activated as in the read operation despite the fact that the read operation is not performed during this process. If this signal is output as the bus drive signal Busdrive_1 to the read/write amplifier 34 (FIG. 1), this may cause a malfunction. The output gate circuit 61*dc* is provided to prevent the malfunction.

More specifically, to one input end (or an end portion in which an inverter circuit is provided) of the output gate circuit 61dc, the output signal (first signal) of the internal circuit 61db is supplied; to the other input end (or an end portion in which no inverter circuit is provided), the refresh command IREF2 is supplied. Accordingly, the output signal of the internal circuit 61db is output as the bus drive signal Busdrive_1 only when the refresh command IREF2 is inactivated (or at a low level). When the refresh command IREF2 is activated (or at a high level), the output of the output gate circuit 61dc is fixed to a low level.

As described above, the refresh control circuit 40 simultaneously activates the refresh commands IREF1 and IREF2, but inactivates the refresh command IREF1 earlier than the refresh command IREF2. As a result, the refresh command IREF2 is always activated at a time when the signal that is output from the internal circuit 61db in response to activation of the refresh command IREF1 has reached the one input end of the output gate circuit 61dc. Therefore, it can be said that the semiconductor device 10 is designed to prevent, unlike during the read operation, activation of the bus drive signal Busdrive_1 in response to activation of the refresh command IREF1.

As described above, in the semiconductor device 10 of the present embodiment, even if the read command MREAD is fixed to the inactivated state, a plurality of transistors in the delay circuits 61a to 61d can be in the first operation state as when the read command MREAD is generated, when the refresh command IREF0 is generated. Moreover, the delay circuits 61a to 61d are configured in such a way that a plurality of transistors inside the delay circuits 61a to 61d will be in the first operation state in response to the refresh command IREF0. Therefore, the first operation state is not kept for a long time. Furthermore, unlike during the read operation, the output signals CYE, RAE, Busdrive_0 and Busdrive_1 of the timing control circuit 41 do not become activated, even as a plurality of transistors inside the delay circuits 61a to 61d are in the first operation state in response to the refresh command IREF0. Therefore, the semiconductor device 10 of the present embodiment can appropriately suppress the occurrence of the BTI deterioration in a plurality of transistors inside the delay circuits 61a to 61d.

Moreover, in the semiconductor device 10 of the present embodiment, the refresh command IREF0 is used as a command for putting a plurality of transistors inside the delay circuits 61a to 61d in the first operation state and the refresh command IREF0 is activated at regular intervals as described above. Therefore, according to the semiconductor device 10 of the present embodiment, the advantage is that it is possible to reliably decrease the BTI deterioration of a plurality of transistors inside the delay circuits 61a to 61d, compared with the use of other commands.

The above description focuses on circuits inside the timing control circuit 41 that are related to the read operation. However, the same configuration can be applied to those pertaining to the write operation to suppress the occurrence of BTI deterioration. The details will be described below.

Figure 4B:
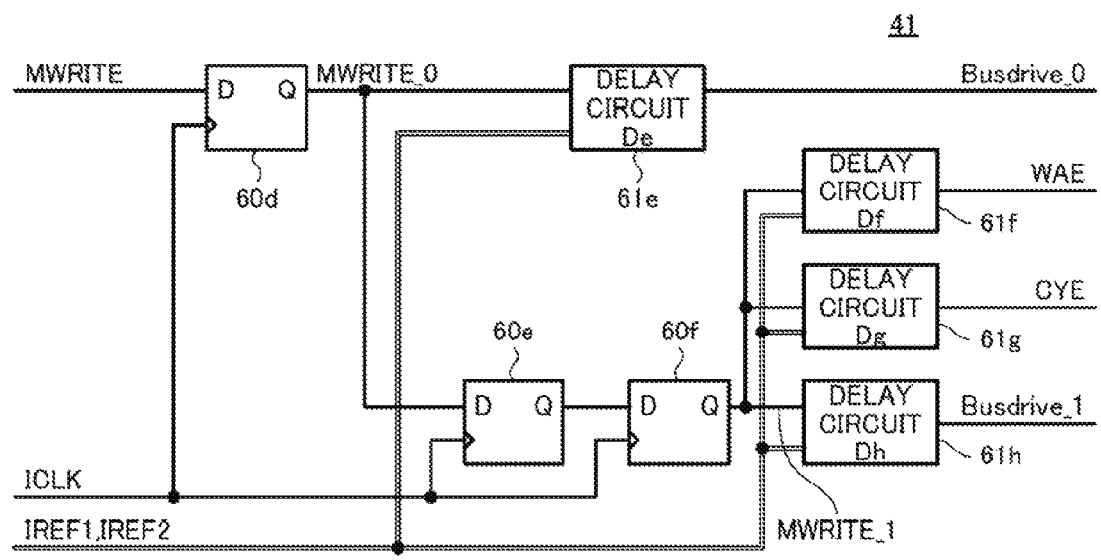
FIG. 4B is a diagram showing some of the internal circuits of the timing control circuit shown in FIG. 1 that are related to a write operation.

For the write operation, as shown in FIG. 4B, the timing control circuit 41 includes D-type latch circuits 60d to 60f and delay circuits 61e to 61h. To the clock terminals of the latch circuits 60d to 60f, the internal clock signal ICLK is supplied.

The write command MWRITE is supplied to an input terminal of the latch circuit 60d. The latch circuit 60d is a circuit that latches the write command MWRITE in response to a rising edge of the internal clock signal ICLK and then outputs as a write command MWRITE_0. The output write command MWRITE_0 is supplied to the delay circuit 61e and the latch circuit 60e.

The delay circuit 61e is a circuit that delays the write command MWRITE_0 by an amount equivalent to a delay time De and then outputs as a bus drive signal Busdrive_0. The latch circuits 60d to 60f are connected in series. Therefore, the write command MWRITE_1 output from the latch circuit 60f is a signal that has been delayed by an amount equivalent to two clocks compared with the write command MWRITE_0. The write command MWRITE_1 is supplied to the delay circuits 61f to 61h.

The delay circuits 61f to 61h are circuits that delay the write command MWRITE_1 by amounts equivalent to delay times Df, Dg and Dh, respectively. The output signals of the delay circuits 61f to 61h are a write enable signal WAE, a column switch enable signal CYE, and a bus drive signal Busdrive_1, respectively.

As in the case of the delay circuits 61a to 61d for the read operation, the refresh commands IREF1 and IREF2 are supplied to the delay circuits 61e to 61h. The internal configuration of the delay circuits 61e to 61h is the same as that of the delay circuit 61d shown in FIG. 5A. Accordingly, as in the case of the delay circuits 61a to 61d, even in the delay circuits 61e to 61h, the occurrence of BTI deterioration in a plurality of transistors that make up the internal circuits is appropriately suppressed.

Figure 7:
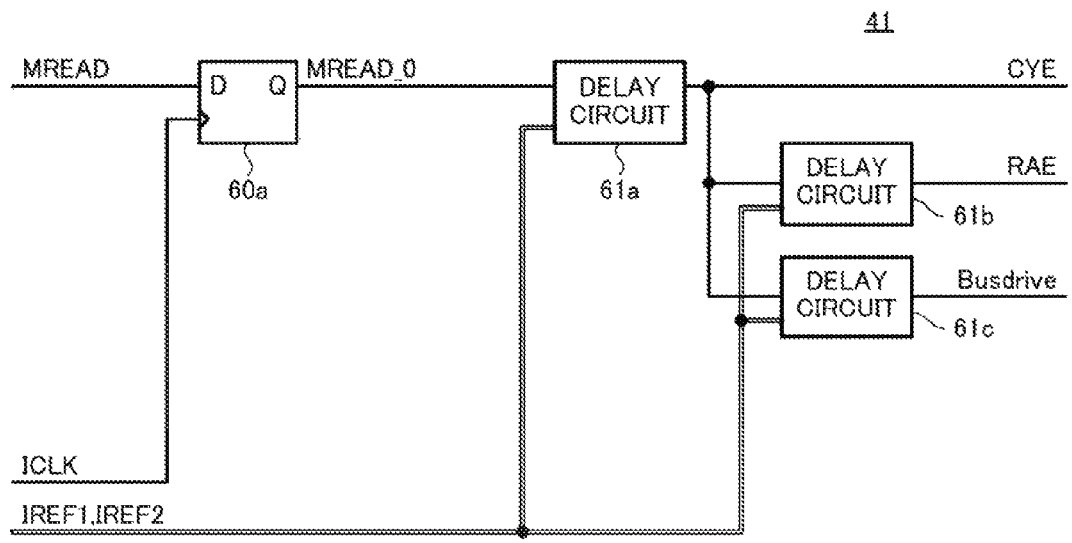
FIG. 7 is a diagram showing some of internal circuits of a timing control circuit that are related to a read operation, in a semiconductor device of a second embodiment of the present invention.

With reference to FIG. 7, a semiconductor device of a second embodiment of the present invention will be described.

In the semiconductor device 10 of the first embodiment, to one read/write bus RWBS, two read/write amplifiers 34 are connected (See FIG. 2). However, in the semiconductor device of the present embodiment, to one read/write bus RWBS, one read/write amplifier 34 is connected. Accordingly, the semiconductor device of the present embodiment includes 8×N read/write buses RWBS. Therefore, there is no need to switch the read/write amplifiers 34 to be connected to the read/write buses RWBS. As a result, instead of the bus drive signals Busdrive_0 and Busdrive_1, as shown in FIG. 7, only one bus drive signal Busdrive is used. The rest of the configuration is the same as that of the semiconductor device 10 of the first embodiment. The following description focuses on the differences.

Since the single bus drive signal Busdrive is used, unlike the timing control circuit 41 shown in FIG. 4, a timing control circuit 41 of the present embodiment, as shown in FIG. 7, does not have a structure (or latch circuits 60b and 60c and delay circuit 61d) for generating the bus drive signal Busdrive_1. The rest of the configuration is the same as that of the timing control circuit 41 shown in FIG. 4: From the delay circuits 61a to 61c, a column switch enable signal CYE, a read enable signal RAE, and a bus drive signal Busdrive are output.

As in the case of the delay circuits 61a to 61c of the first embodiment, the refresh commands IREF1 and IREF2 are supplied to the delay circuits 61a to 61c of the present embodiment. Therefore, in the semiconductor device of the present embodiment, the occurrence of BTI deterioration in a plurality of transistors inside the delay circuits 61a to 61c can be appropriately suppressed.

Figure 8:
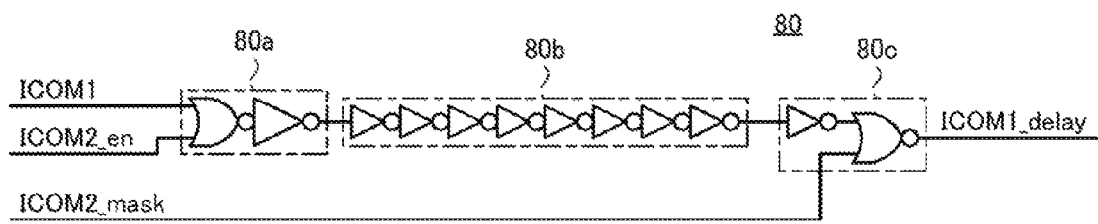
FIG. 8 is a diagram showing the internal configuration of a delay circuit 80 in a semiconductor device of a third embodiment of the present invention.

With reference to FIG. 8, a semiconductor device of a third embodiment of the present invention will be described.

The semiconductor device of the present embodiment includes a delay circuit 80 shown in FIG. 8. As shown in FIG. 8, the delay circuit 80 includes an input gate circuit 80a, which is an OR circuit; an internal circuit 80b, which includes plural stage of inverter circuits; and an output gate circuit 80c, which is a NOR circuit having an inverter circuit at one input end thereof. As can be seen from FIG. 5, this configuration is the same as that of the above-described delay circuits 61a to 61h.

Although not shown in the diagram, the semiconductor device of the present embodiment is so configured to perform a control (first control) based on a control signal ICOM1 (first command signal), and to perform a control (second control) based on a control signal ICOM2 (second command signal). To the one input end of the input gate circuit 80a, the control signal ICOM1 is supplied. The output signal of the input gate circuit 80a is supplied to the internal circuit 80b. The output signal of the internal circuit 80b is supplied to one input end (or an end portion in which an inverter circuit is provided) of the output gate circuit 80c. In this manner, the delay circuit 80 is so configured as to output a delay signal ICOM1_delay that is generated by delaying the control signal ICOM1.

To the other input end of the input gate circuit 80a, a control signal ICOM2_en (third command signal) is supplied. To the other input end (or an end portion in which no inverter circuit is provided) of the output gate circuit 80c, a control signal ICOM2_mask (fourth command signal) is supplied. The control signal ICOM2_en is a signal that is activated to a high level in response to activation of the control signal ICOM2. The control signal ICOM2_mask is a signal that is designed to fix the output of the output gate circuit 80c, thereby preventing activation of the delay signal ICOM1_delay during a period in which the control signal ICOM2 is activated.

According to the above configuration, even if the control signal ICOM1 is fixed to the inactivated state, the semiconductor device of the present embodiment can put a plurality of transistors (or, more specifically, transistors that make up the inverter circuits of the internal circuit 80b) inside the delay circuit 80 in the same operation state (first operation state) as when the control signal ICOM1 is generated, when the control signal ICOM2 is generated. Moreover, the delay circuit 80 is configured in such a way that a plurality of transistors inside the delay circuit 80 will be in the first operation state in response to the control signal ICOM2. Therefore, the first operation state is not kept for a long time. Furthermore, even if a plurality of transistors in the delay circuit 80 are in the first operation state in response to the control signal ICOM2, the delay signal ICOM1_delay does not become activated in a similar way to when the control signal ICOM1 is activated. Therefore, in the semiconductor device of the present embodiment, the occurrence of BTI deterioration in a plurality of transistors inside the delay circuit 80 can be appropriately suppressed.

Incidentally, the delay circuit 80 of the present embodiment may be used as the delay circuits 61a to 61h, which are described in the first and second embodiments. In this case, the control signal ICOM1 is equivalent to the read command MREAD or the write command MWRITE; the control signals ICOM2_en and ICOM2_mask are equivalent to the refresh commands IREF1 and IREF2, respectively. Needless to say, the delay circuit 80 can be used for other purposes.

It is apparent that the present invention is not limited to the above embodiments, but may be modified and changed without departing from the scope and spirit of the invention.

For example, what is described in the above first to third embodiments is plural stage of inverter circuits in the delay circuits as internal circuits in which the occurrence of BTI deterioration is to be prevented. However, the present invention can be applied not only to plural stage of inverter circuits in the delay circuits, but also to a wide range of circuits containing transistors that might undergo the BTI deterioration.

The present invention can be applied to a wide range of semiconductor devices that are controlled by commands, including: volatile memories, such as SRAM (Static Random Access Memory); and nonvolatile memories, such as flash memories, PRAM (Phase change Random Access Memory), ReRAM (Resistance Random Access Memory) and STT-RAM (Spin Transfer Torque Random Access Memory). Furthermore, the present invention can be applied to a controller which is a device that issues commands.

For the present invention, in short, it is only necessary to be capable of a compulsory drive of a circuit which have a possibility not to be used for a certain period. Therefore, it may work to provide a counter (or a timer), to start a count operation (or a timing operation) by the counter (or the timer) at a timing when an access to the target circuit has finished, and to drive the target circuit by compulsion in case it is detected that no access has been made to the target circuit for a certain period as a result of the count operation (or the timing operation). To put it more specifically taking a case this configuration is applied to the delay circuit 61d (see FIG. 5A) explained in the first embodiment as an example, it may work to start a count operation in response to a falling edge of the read command MREAD_1 and to activate the refresh commands IREF1 and IREF2 in case the count value reaches a predetermined value. In this case, it is not necessary to generate the refresh commands IREF1 and IREF2 in response to the refresh command IREF0.

What is claimed is:

1. A semiconductor device comprising:
an amplifier circuit configured to amplify a data signal in response to a timing signal, wherein the timing signal indicates a column access command;
a timing control circuit including a delay circuit and configured to receive a first command signal driving the delay circuit in order to produce the timing signal; and
a refresh control circuit configured to respond to a second command signal indicating a refresh command to produce a third command signal, the third command signal being transferred to the delay circuit in the timing control circuit in order for the third command signal to drive the delay circuit.

2. The semiconductor device as claimed in claim 1, wherein the timing control circuit is configured to fix the timing signal to a low level in case the delay circuit is driven by the third command signal.

3. The semiconductor device as claimed in claim 2, wherein
the refresh control circuit further produces a fourth command signal in response to the second command signal; and
the timing control circuit is configured to fix the timing signal to a low level while the fourth command signal is activated.

4. A semiconductor device comprising:
an amplifier circuit configured to amplify a data signal in response to a timing signal;
a timing control circuit including a delay circuit and configured to receive a first command signal driving the delay circuit in order to produce the timing signal; and
a refresh control circuit configured to respond to a second command signal indicating a refresh command to produce a third command signal and a fourth command signal, the third command signal being transferred to the delay circuit in the timing control circuit in order for the third command signal to drive the delay circuit and wherein the refresh control circuit is configured to activate the third and fourth command signals simultaneously and then inactivate the third command signal earlier than the fourth command signal, wherein the timing control circuit is configured to fix the timing signal to a low level in case the delay circuit is driven by the third command signal and wherein the timing control circuit is configured to fix the timing signal to a low level while the fourth command signal is activated.

5. A semiconductor device comprising:
a timing control circuit including a delay circuit and configured to receive a first command signal driving the delay circuit in order to produce a timing control signal, wherein the timing control signal indicates a column access command; and
a refresh control circuit configured to respond to a second command signal indicating a refresh command to produce a third command signal, the third command signal being transferred to the delay circuit in the timing control circuit in order for the third command signal to drive the delay circuit.

6. The semiconductor device as claimed in claim 5, wherein the timing control circuit is configured to fix the timing control signal to a low level in case the delay circuit is driven by the third command signal.

7. The semiconductor device as claimed in claim 6, wherein the refresh control circuit further produces a fourth command signal in response to the second command signal; and the timing control circuit is configured to fix the timing control signal to a low level while the fourth command signal is activated.

8. A semiconductor device comprising:
a timing control circuit including a delay circuit and configured to receive a first command signal driving the delay circuit in order to produce a timing control signal; and
a refresh control circuit configured to respond to a second command signal indicating a refresh command to produce a third command signal and a fourth command signal, the third command signal being transferred to the delay circuit in the timing control circuit in order for the third command signal to drive the delay circuit, wherein the refresh control circuit is configured to activate the third and fourth command signals simultaneously and then inactivate the third command signal earlier than the fourth command signal, wherein the timing control circuit is configured to fix the timing control signal to a low level in case the delay circuit is driven by the third command signal and wherein the timing control circuit is configured to fix the timing control signal to a low level while the fourth command signal is activated.

9. The semiconductor device as claimed in claim 5, further comprising:
a memory cell array including a plurality of word lines, a plurality of bit lines and a plurality of memory cells each coupled to the respective word and bit lines;
a first control circuit configured to drive the plurality of word lines;
a second control circuit configured to select at least one of the plurality of bit lines; and wherein the timing control circuit is configured to control a timing when the second control circuit selects at least one of the plurality of bit lines by using the delay circuit.

10. The semiconductor device as claimed in claim 9, wherein the first and second control circuits are activated to drive a word line among the word lines and select a bit line among the bit lines to select a memory cell corresponding the driven word line and the selected bit line.

11. A semiconductor device comprising:
a timing control circuit including a delay circuit and configured to receive a first command signal driving the delay circuit in order to produce a timing control signal; and
a refresh control circuit configured to respond to a second command signal indicating a refresh command to produce a third command signal, the third command signal being transferred to the delay circuit in the timing control circuit in order for the third command signal to drive the delay circuit;
a memory cell array including a plurality of word lines, a plurality of bit lines and a plurality of memory cells each coupled to the respective word and bit lines;
a first control circuit configured to drive the plurality of word lines;
a second control circuit configured to select at least one of the plurality of bit lines; and
wherein the timing control circuit is configured to control a timing when the second control circuit selects at least one of the plurality of bit lines by using the delay circuit,
wherein the first and second control circuits are activated to drive a word line among the word lines and select a hit line among the bit lines to select a memory cell corresponding the driven word line and the selected bit line,
wherein the first control circuit is activated and the second control circuit is inactivated to drive a word line among the word lines and not to select any bit lines, and
wherein the timing control circuit is activated when the first control circuit is activated and the second control circuit is inactivated.

12. A semiconductor device comprising:
a timing control circuit including a delay circuit and configured to receive a first command signal driving the delay circuit in order to produce a timing control signal;
a refresh control circuit configured to respond to a second command signal indicating a refresh command to produce a third command signal, the third command signal being transferred to the delay circuit in the timing control circuit in order for the third command signal to drive the delay circuit;
a memory cell array including a plurality of word lines, a plurality of bit lines and a plurality of memory cells each coupled to the respective word and bit lines;
a first control circuit configured to drive the plurality of word lines;
a second control circuit configured to select at least one of the plurality of bit lines; and
a command generation circuit configured to generate the first and second command signals,
wherein the timing control circuit is configured to control a timing when the second control circuit selects at least one of the plurality of bit lines by using the delay circuit, wherein the second control circuit is configured to select the at least one of the plurality of bit lines at a timing responding to an output signal of the delay circuit, and the timing control circuit is configured to put the delay circuit in a first operation state either when the first command signal is activated or when the second command signal is activated, the timing control circuit being configured to fix the output signal of the delay circuit to a low level when the second command signal is activated.

13. The semiconductor device as claimed in claim 12, further comprising a refresh control circuit configured to generate the third command signal in response to the second command signal being activated, wherein the timing control circuit puts the delay circuit in the first operation state when at least one of the first and third command signals is activated.

14. The semiconductor device as claimed in claim 13, wherein the refresh control circuit further generates a fourth command signal when the second command signal is activated; and the timing control circuit is configured to fix the output signal of the delay circuit to a low level while the fourth command signal is activated.

15. A semiconductor device comprising:
a delay circuit configured to receive a first command signal to produce a timing signal, wherein the timing signal indicates a column access command; and
a refresh control circuit configured to respond to a second command signal indicating a refresh command to produce a third command signal, the third command signal being transferred to the delay circuit in order for the third command signal to drive the delay circuit.

16. The semiconductor device as claimed in claim 15, wherein the delay circuit comprises a first gate circuit configured to receive the first command and the third command signals.

17. The semiconductor device as claimed in claim 16, wherein the refresh control circuit is configured to produce a fourth command signal,
wherein the delay circuit further comprises:
a delay path configured to receive an output of the first gate circuit; and
a second gate circuit configured to receive an output of the delay path and the fourth command signal.

18. The semiconductor device as claimed in claim 17, further comprising:
a row control circuit configured to drive a word line,
wherein the refresh control circuit is configured to produce a fifth command signal applied to the row control circuit.

* * * * *

UNITED STATES PATENT AND TRADEMARK OFFICE
CERTIFICATE OF CORRECTION

PATENT NO. : 9,728,246 B2
APPLICATION NO. : 15/236281
DATED : August 8, 2017
INVENTOR(S) : Keisuke Fujishiro et al.

It is certified that error appears in the above-identified patent and that said Letters Patent is hereby corrected as shown below:

On the Title Page

|  | Reads | Should Read |
|---|---|---|
| Foreign Priority | Foreign priority omitted | Japan 2013-133557, June 26, 2013 |

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*